United States Patent
Shimono

(10) Patent No.: US 6,308,293 B1
(45) Date of Patent: Oct. 23, 2001

(54) FAULT DIAGNOSIS APPARATUS AND RECORDING MEDIUM WITH A FAULT DIAGNOSIS PROGRAM RECORDED THEREON

(75) Inventor: Takeshi Shimono, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/161,522

(22) Filed: Sep. 29, 1998

(30) Foreign Application Priority Data

Sep. 30, 1997 (JP) ................................... 9-282572

(51) Int. Cl.$^7$ .......................... G01R 31/28; G01R 31/30; G06F 11/00
(52) U.S. Cl. .............................................. 714/741
(58) Field of Search ............................ 714/741, 25, 738; 324/765; 365/200, 225.7; 257/48, 401, 723, 786

(56) References Cited

U.S. PATENT DOCUMENTS

| | | | |
|---|---|---|---|
| 3,579,252 | * 5/1971 | Goodman | 371/25.1 |
| 5,270,642 | * 12/1993 | Parker | 714/727 |
| 5,321,354 | * 6/1994 | Ooshima et al. | 324/765 |
| 5,465,383 | * 11/1995 | Shimono et al. | 714/27 |
| 5,889,789 | * 3/1999 | Sanada | 714/745 |

FOREIGN PATENT DOCUMENTS

| | | | |
|---|---|---|---|
| 1-156680 | 6/1989 | (JP) | G01R/31/28 |
| 1-244384 | * 9/1989 | (JP) . | |
| 2-105437 | 4/1990 | (JP) | H01L/21/66 |
| 2-140678 | 5/1990 | (JP) | G01R/31/28 |
| 3-105431 | 5/1991 | (JP) | G06F/11/22 |
| 4-55776 | 2/1992 | (JP) | G01R/31/28 |
| 5-157820 | 6/1993 | (JP) | G01R/31/28 |
| 6-160475 | 6/1994 | (JP) | G01R/31/28 |

OTHER PUBLICATIONS

Gruetzner et al.(Simulation and Test of Faults in WSI Interconnect Systems; IEEE, Jan. 1989).*
Weiner (A Fault Model and a Test for Analog Fuzzy Logic Circuits; IEEE, Oct. 1995).*
Mahlstedt et al.(Determiniostic Test Generation for Non–Classical Faults on the Gate Level; IEEE, Nov. 1995).*
Raahemifar et al.(A Design for Testability Technique for Shorts and Bridging Faults in BiCMOS Logic Families; IEEE, Sep. 1995).*

(List continued on next page.)

Primary Examiner—Albert Decady
Assistant Examiner—Guy Lamarre
(74) Attorney, Agent, or Firm—Foley & Lardner

(57) ABSTRACT

The invention provides a fault diagnosis apparatus which estimates a disconnection fault site intermediate of a branch wiring line in an LSI based on a result of an LSI test performed by using a test pattern. An indefinite value simulation narrowing down section uses a test pattern to perform, for each gate included in a suspected fault gate set, a simulation wherein the output value of the gate is set to an indefinite value, and removes any gate from which a definite value is outputted among those outputs which have been determined to be errors with error test patterns. An output value check narrowing down section removes any gate from the suspected fault gate set if the gate satisfies a condition that the output value thereof at least in one error test pattern is different from that in the other error test patterns. Finally, a branch destination fault simulation narrowing down section defines 0/1 stuck-at faults to output branch designations of each gate included in the suspected fault gate set and performs a logic simulation using the test pattern. Then, the branch destination fault simulation narrowing down section removes any gate from the suspected fault gate set if the gate does not have an output branch destination fault which is not detected at a normal output but is detected at an error output.

24 Claims, 16 Drawing Sheets

OTHER PUBLICATIONS

Shimino (An Efficient Logical Fault Diagnosis for Combinational Circuits Using Stuck–at Fault Simulation; IEEE, Nov. 1994).*

Favalliet al.(Modeling and Simulation of Broken connections in CMOS IC's; IEEE, Jul. 1996).*

Di et al.(On Accurate Modeling and Efficient Simulation of CMOSs Opens; IEEE, Oct. 1993).*

T. Shimono et al., "NEC Research & Development", *A Method for Locating Faults Using Fault Simulation*, vol. 36, No. 3, pp. 383–390, Jul. 1995.

* cited by examiner

FAULT DIAGNOSIS APPARATUS AND RECORDING MEDIUM WITH A FAULT DIAGNOSIS PROGRAM RECORDED THEREON

BACKGROUND OF THE INVENTION

1. Field of the Invention

This invention relates to a fault diagnosis apparatus for an LSI, and more particularly to a fault diagnosis apparatus useful for a disconnection fault of a wiring pattern and a recording medium on which a fault diagnosis program is recorded.

2. Description of the Related Art

As a technique useful for a fault diagnosis of an LSI, a method is available which employs an apparatus which can directly observe a signal behavior in the inside of an LSI (an apparatus of the type mentioned is hereinafter referred to an internal signal observation apparatus) such as electron beam tester (EB tester). However, since an internal signal observation apparatus of the type described requires much time for measurement, it is not effective for a large scale circuit to use only the internal signal observation apparatus from the beginning to trace or search for a fault site from an output with which an error has been observed since a very long time is required for observation of signals and narrowing down of fault site candidates.

Thus, several fault diagnosis techniques have been proposed wherein fault sites in an LSI are estimated from a result of comparison between output signals and scan-out signals of the LSI obtained from an LSI tester and expected values for them and places to be observed directly are reduced by a large number by means of an internal signal observation apparatus such as an EB tester.

For example, Japanese Patent Laid-Open Application No. Heisei 1-244384 discloses a technique wherein a circuit pattern in which only one route is activated from an input to an output of the circuit is used to perform a test and a fault site is estimated from failed outputs and passed outputs by comparison with expected values obtained by an LSI tester and a list of faults which are activated with the pattern then (hereinafter referred to as first prior art).

Japanese Patent Laid-Open Application No. Heisei 4-55776 discloses another technique which compares, making use of a fact that a designer can estimate a gate or a state which makes a cause of a fault from a result of a test by an LSI tester, a result of a simulation performed by assuming suspected fault sites and a result of comparison with expected values by an LSI tester to verify whether or not the estimation is correct (hereinafter referred to as second prior art).

Among various faults of LSI circuits, a disconnection of a wiring pattern and a disconnection by an incomplete contact exhibit high frequencies of occurrence. For example, a disconnection of a wiring line pattern upon production of an LSI which is caused by dust on a mask, a disconnection which arises from flowing of overcurrent during operation and a disconnection which is caused by deterioration by use for a long period of time are possible. Most wiring patterns have branches, and if a disconnection occurs intermediately of a branch, then a signal operates normally at a portion of the branch forwardly of the disconnected site while the signal does not operate in the branch rearwardly of the disconnected site but is fixed, entering a fault mode which cannot be represented by a single stuck-at fault.

The first prior art described above has a problem in that, since it presumes a single stuck-at fault as a fault, for such a disconnection fault of a wiring pattern which is a fault mode which cannot be represented by a single stuck-at fault as described above, it cannot effectively narrow down fault site candidates.

On the other hand, the second prior art can handle any fault and can diagnose also a disconnection fault intermediate of a branch of a wiring line. However, as an increase in scale and complication of a circuit proceeds, an increasing number of designers participate in cooperative development of an LSI, resulting in such a situation that almost none of the designers possibly knows the entire circuitry of the LSI to such a degree that a possible fault site can be estimated. Accordingly, the second prior art which presumes that a possible fault can be estimated by a designer cannot be applied well to an LSI of a large scale. Further, even if the second prior art is applied, if a designer estimates fault sites and confirms them one after another by a simulation, then very much labor is required, and therefore, this is not practical.

SUMMARY OF THE INVENTION

It is an object of the present invention to provide a fault diagnosis apparatus which can narrow down, for a disconnection fault intermediate of a branch wiring line which cannot conventionally be diagnosed automatically, fault site candidates with a high degree of accuracy based on a result of comparison with expected values by means of an LSI tester.

In order to attain the object described above, according to the present invention, an error test pattern which is a test pattern with which outputs of expected values have not been obtained by an LSI test for a fault diagnosis object LSI or the like is utilized to perform narrowing down of fault candidates based on a condition to be satisfied where the LSI suffers from a disconnection fault intermediate of a branch wiring line.

More particularly, according to an aspect of the present invention, there is provided a fault diagnosis apparatus which estimates a fault site in a fault diagnosis object LSI based on a result of an LSI test performed using a test pattern for the LSI, comprising suspected fault gate setting means for setting candidates for a suspected fault gate to a suspected fault gate set, and output value check narrowing down means for checking, for each of the suspected fault gates included in the suspected fault gate set, whether or not a condition is satisfied that an output value of the suspected fault gate at least in an error test pattern is different from that of the suspected fault gate in the other error test patterns, and removing those of the suspected fault gates with which the condition is satisfied from the suspected fault gate set.

The fault diagnosis apparatus may comprise, in place of or in addition to the output value check narrowing down means, branch destination fault simulation narrowing down means for defining a 1/0 stuck-at fault to each of output branch destinations of the suspected fault gates included in the suspected fault gate set and performing a fault simulation for each one test pattern, removing, for each fault simulation, the fault definitions of output branch destinations detected with normal outputs, and removing those of the suspected fault gates from which the fault definitions of all of the respective output branch destinations have been removed and those of the suspected fault gates with which, in any of the error test patterns, none of the fault definitions of the respective output branch destinations have not been detected with outputs which are determined to be errors with the error test pattern from the suspected fault gate set.

The fault diagnosis apparatus may further comprise indefinite value simulation narrowing down means for performing, for each of the suspected fault gates included in the suspected fault gate set, a simulation in which an error test pattern is used and an output of the suspected fault gate is set to an indefinite value and removing any of the suspected fault gates with which at least one of those outputs which have been determined to be errors with the error test pattern exhibits a definite value from the suspected fault gate set.

While the plurality of narrowing down means may be applied in any order, since the indefinite value simulation narrowing down means can be constructed so as to operate at a higher speed than the other narrowing down means, the fault diagnosis apparatus is preferably constructed such that, for the suspected fault gate set after narrowing down of candidates for the suspected fault gate by the indefinite value simulation narrowing down means is performed, narrowing down of the candidates for the suspected fault gate by the output value check narrowing down means or by the branch destination fault simulation narrowing down means is performed.

Preferably, the suspected fault gate setting means sets only those gates whose outputs are each branched into three or more branches as the candidates for the suspected fault gate.

Preferably, the fault diagnosis apparatus further comprises fault site confirmation means for observing, for those of the suspected fault gates included in the suspected fault gate set after narrowing down of the candidates for the suspected fault gate is performed, gate output points and end points of branch destinations of wiring line patterns of the outputs using an internal signal observation apparatus such as an electron beam tester to confirm a fault on the wiring pattern.

It is considered that a segment of a wiring line of an output of a gate rearwardly of a disconnection site does not exhibit a signal variation and is logically fixed to 0 or 1 even if the output of the gate varies. If the output value of the gate coincides with the fixed value of the signal rearwardly of the disconnection site in a certain test pattern, then in the test pattern, all signals apparently assume same values as normal values and must not have been determined as errors by expected value comparison by an LSI tester. Accordingly, in a test pattern with which an error is exhibited, the output value of the fault gate and the fixed values of the signals rearwardly of the disconnection site must have the opposite values. The signals rearwardly of the disconnection site are the same through all patterns. Accordingly, in a test pattern with which an error is exhibited (error test pattern), all output values of the fault gate must be same. Based on this principle, if the output values of the suspected fault gate are all the same with all test patterns with which an error is detected, then it can be discriminated that the gate still is a suspected fault gate, but if all of the output values of the suspected fault gate are not the same, that is, if the output value of the suspected fault gate with at least one error test pattern is different from those with the other error test patterns, then the suspected fault gate can be excepted from the candidates. Narrowing down performed by the output value check narrowing down means is based on the principle just described.

Further, since the signals rearwardly of the disconnection site exhibit the same values, one of a 0 stuck-at fault and a 1 stuck-at fault of a branch destination rearwardly of the disconnection site must be detected with one of the outputs which have been determined to be errors by the expected value comparison by the LSI tester. Since there possibly is a case wherein errors occur with a large number of outputs because a plurality of branch destination signals simultaneously exhibit fixed values, a fault at one site is not necessarily detected with all error outputs, but the fault must not be detected at an output at which no error is outputted. Based on the principle just described, 0/1 stuck-at faults are defined for branch destinations of an output of a suspected fault gate. In this instance, it can be discriminated that any gate having a branch destination fault which is detected at an output which has been determined to be an error but is not detected at an output which has not been determined to be an error still remains as a suspected fault gate. On the contrary, any suspected fault gate having output branch destinations none of whose output definition faults are detected at outputs which have been determined to be errors with some error test pattern and any suspected fault gate having output branch destinations all of whose faults are detected at normal outputs of some test pattern can be excepted from the candidates. Narrowing down by the branch destination fault simulation narrowing down means is based on the principle just described.

Where a wiring pattern having branches has an intermediate disconnection, a signal which branches forwardly of the disconnection operates normally, but another signal which branches rearwardly of the disconnection site does not exhibit a variation. The signal line having a disconnection in this manner may possibly operate in different manners at different branch destinations. Where a simulation wherein the output value of a suspected fault gate is set to an indefinite value is performed, the range in which the fault has an influence can be determined at whichever site a wiring line of an output signal of the gate has an intermediate disconnection. As a result, it can be considered that an output to which not an indefinite value but a definite value is outputted is not influenced by the fault, and if the output has been determined to be an error by expected value comparison by an LSI tester, then it can be considered that conversely the output of the gate does not have a disconnection fault. Based on the principle just described, fault candidates can be narrowed down by the indefinite value simulation narrowing down means.

On the other hand, where a fault site has a fault equivalent to a single stuck-at fault, fault candidates can be narrowed down by a conventional technique. Accordingly, the processing time can be reduced if the fault diagnosis apparatus of the present invention is applied only to disconnection faults intermediate of branch wiring lines which cannot be narrowed down by a conventional technique. In this instance, where a wiring line which has no branch has a disconnection, the disconnection is equivalent to a stuck-at fault of an output of the gate at whichever site the wiring line suffers from the disconnection. On the other hand, where a wiring line having two branches has a disconnection forwardly of the branching site, the disconnection is equivalent to a stuck-at fault of the output of the gate, but where the disconnection is rearwardly of the branching site, the disconnection is equivalent to a stuck-at fault of an input to a gate of the branch destination. Accordingly, a disconnection fault which is not equivalent to a single stuck-at fault occurs only with a wiring line having three or more branches. From this, by setting only those gates each having an output branched to three or more branches to candidates for a suspected fault gate, the fault narrowing down time can be reduced significantly.

Further, where a disconnection fault occurs intermediately of a branch wiring line, the output signal of the gate operates normally, and the wiring line segment rearwardly of the disconnection site exhibit a fixed value. Accordingly, in order to confirm this fault finally, an output point of a suspected fault gate narrowed down and end points of branch destinations of the output are observed using an EB tester or the like. Thus, the disconnection fault on the wiring line pattern can be confirmed with certainty.

The fault diagnosis apparatus according to the present invention described above is advantageous in that it can automatically narrow down fault site candidates regarding disconnection faults intermediate of branch wiring lines which cannot be represented by a single stuck-at fault model. The reason is that the output value check narrowing down means and the branch destination fault simulation narrowing down means perform narrowing down of the fault site candidates using conditions which are satisfied by a disconnection fault intermediate of a wiring line. This allows diagnosis of faults in a wide range which cannot conventionally been diagnosed.

The fault diagnosis apparatus is advantageous also in that, where a plurality of narrowing down means (output value check narrowing down means, branch destination fault simulation narrowing down means and indefinite value simulation narrowing down means) are successively used, narrowing down of fault site candidates which cannot be narrowed down by a single one of the narrowing down means can be performed, and this allows narrowing down of fault site candidates with a high degree of accuracy.

The fault diagnosis apparatus is advantageous further in that, where output value check narrowing down or branch destination fault simulation narrowing down is performed after narrowing down by indefinite value simulation, the number of candidates for a suspected fault gate can be reduced in a short time by narrowing down by the indefinite value simulation which can be processed at a comparatively high speed, and since output value check narrowing down or branch destination fault simulation narrowing down is performed for suspected fault gates after such reduction, the time required for the narrowing down is reduced. Consequently, narrowing down of fault site candidates as a whole can be performed with a high degree of accuracy in a short time.

The fault diagnosis apparatus is advantageous also in that, where only those gates which have three or more branches are set as initial values for a suspected fault gate, narrowing down can be performed efficiently in a short time for a disconnection fault intermediate of a branch wiring line which cannot be narrowed down with a single stuck-at fault model. Consequently, the processing time where the fault diagnosis apparatus is combined with a conventional technique directed to a single stuck-at fault can be reduced.

The fault diagnosis apparatus is advantageous further in that confirmation of a fault site can be performed simply and with certainty by means of an EB tester or the like based on a result of the narrowing down. The reason is that, since the fault is diagnosed as a disconnection fault intermediate of a branch wiring line, a fault site can be confirmed only by observing an output point of a suspected fault gate and end points of branch destinations as observation points.

According to another aspect of the present invention, there is provided a recording medium having recorded thereon a fault diagnosis program for estimating a fault site in a fault diagnosis object LSI based on a result of an LSI test performed using a test pattern for the LSI, the fault diagnosis program causing a computer to execute a first step of setting candidates of a suspected fault gate to a suspected fault gate set. and a second step of checking, for each of the suspected fault gates included in the suspected fault gate set, whether or not a condition is satisfied that an output value of the suspected fault gate at least in an error test pattern is different from that of the suspected fault gate in the other error test patterns, and removing those of the suspected fault gates with which the condition is satisfied from the suspected fault gate set.

The second step may include (a) a step of receiving an error test pattern as an input, determining, for each of the suspected fault gates included in the suspected fault gate set, an output value of the suspected fault gate by a logic simulation performed by using the inputted error test pattern and recording the output value, (b) a step of receiving another error test pattern as an input, determining, for each of the suspected fault gates included in the suspected fault gate set, an output value of the suspected fault gate by a logic simulation performed by using the inputted error test pattern, and removing the suspected fault gate from the suspected fault gate set if the output value of the suspected fault gate is different from the output value of the suspected fault gate recorded in the step (a), and (c) a step of repeating the steps (a) and (b) if a further error test pattern remains.

The fault diagnosis program may cause the computer to execute, in place of or in addition to the second step, a third step of defining a 1/0 stuck-at fault to each of output branch destinations of the suspected fault gates included in the suspected fault gate set and performing a fault simulation for each one test pattern, removing, for each fault simulation, the fault definitions of output branch destinations detected with normal outputs, and removing those of the suspected fault gates from which the fault definitions of all of the respective output branch destinations have been removed and those of the suspected fault gates with which, in any of the error test patterns, none of the fault definitions of the respective output branch destinations have not been detected with outputs which are determined to be errors with the error test pattern from the suspected fault gate set.

The third step may include (a) a step of defining a 1/0 stuck-at fault to each of output branch destinations of the suspected fault gates included in the suspected fault gate set, (b) a step of receiving a test pattern as an input and determining, for each of the suspected fault gates included in the suspected fault gate set, at which output the 1/0 stuck-at fault of each of the output branch destinations is detected by a fault simulation performed by using the inputted test pattern, (c) a step of removing the fault definitions of output branch destinations with which 1/0 degeneracy defaults are detected with normal outputs of the test pattern and removing those of the suspected fault gates from which the fault definitions of all of the respective output branch destinations have been removed from the suspected fault gate set, (d) a step of removing those of the suspected fault gates with which, where the test patter is an error test pattern, none of the fault definitions of the respective output branch destinations have not been detected with outputs which are determined to be errors with the error test pattern as a result of the fault simulation from the suspected fault gate set, and (e) a step of repeating the steps (a) to (d) if another test pattern remains.

Preferably, the fault diagnosis program causes the computer to execute a fourth step of performing, for each of the suspected fault gates included in the suspected fault gate set, a simulation in which an error test pattern is used an output of the suspected fault gate is set to an indefinite value and removing any of the suspected fault gates with which at least one of those outputs which have been determined to be errors with the error test pattern exhibits a definite value from the suspected fault gate set.

The fourth step may include (a) a step of receiving an error test pattern as an input and determining, for each of the suspected fault gates included in the suspected fault gate set, an output of the fault diagnosis object circuit by a logic simulation performed by using the inputted error test pattern with an output of the suspected fault gate set to an indefinite value, (b) a step of removing any of the suspected fault gates with which at least one of those outputs which have been determined to be errors with the error test pattern exhibits a definite value from the suspected fault gate set, and (c) a step of repeating the steps (a) and (b) if another error test pattern remains.

Preferably, for the suspected fault gate set after narrowing down of candidates for the suspected fault gate by the fourth step is performed, narrowing down of the candidates for the suspected fault gate by the third step is performed.

Preferably, in the first step, only those gates whose outputs are each branched into three or more branches are set as the candidates for the suspected fault gate.

Preferably, the fault diagnosis program causes the computer to execute a fifth step of observing, for those of the suspected fault gates included in the suspected fault gate set after narrowing down of the candidates for the suspected fault gate is performed, gate output points and end points of branch destinations of wiring line patterns of the outputs using an internal signal observation apparatus such as an electron beam tester to confirm a fault on the wiring pattern.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENTS

Figure 1:
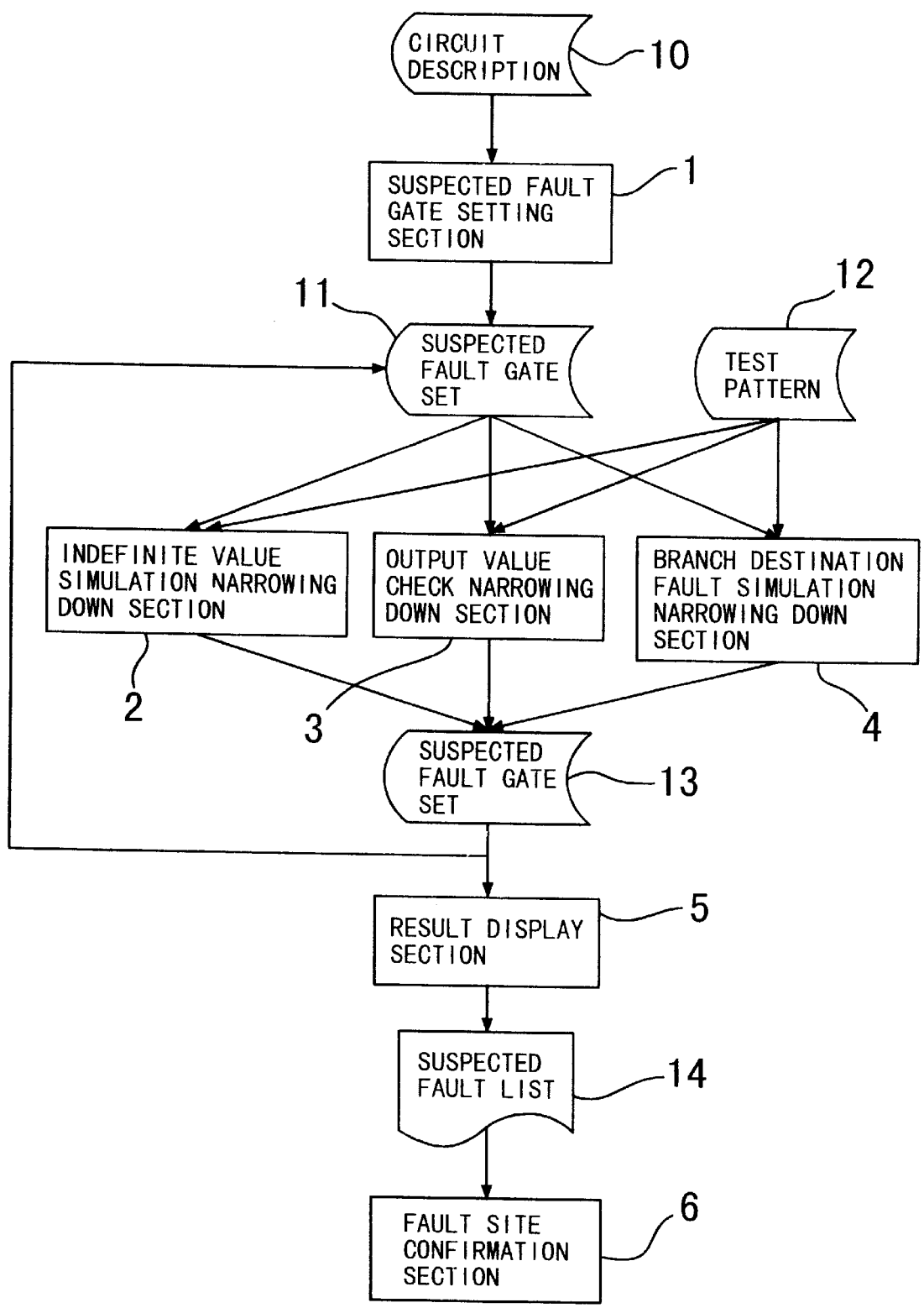
FIG. 1 is a block diagram of a fault diagnosis apparatus to which the present invention is applied.

Referring first to FIG. 1, there is shown a fault diagnosis apparatus to which the present invention is applied. The fault diagnosis apparatus receives a circuit description 10 of an LSI and a test pattern 12 which has been used for an LSI test as inputs thereto and outputs a suspected fault list 14 which is a list of internal fault sites of the LSI. The fault diagnosis apparatus includes functional sections of a suspected fault gate setting section 1, an indefinite value simulation narrowing down section 2, an output value check narrowing down section 3, a branch destination fault simulation narrowing down section 4 and a result display section 5, and further functions for holding and managing suspected fault gate sets 11 and 13. The fault diagnosis apparatus further includes a fault site confirmation section 6 for finally confirming a fault site.

The circuit description 10 includes logic connection information and layout information of an LSI which makes an object of a fault diagnosis. The test pattern 12 is a test pattern which has been used for an LSI test of the LSI which makes an object of the fault diagnosis. The test pattern 12 includes error test patterns which have been determined to be errors and test patters which have been determined to be normal by expected value comparison by an LSI tester. An error test pattern which has been determined to be an error by expected value comparison by an LSI tester signifies a test pattern with which outputs (an output signal and a scan-out signal) of the LSI, which makes an object of a fault diagnosis, obtained when a certain test pattern is inputted to the LSI by the LSI tester do not coincide with expected values.

The suspected fault gate setting section 1 receives, as an input thereto, the circuit description 10 of an LSI which makes an object of a fault diagnosis and sets candidates for a suspected fault gate to the suspected fault gate set 11. The suspected fault gate candidates to be set to the suspected fault gate set 11 may include all gates in the circuit of the LSI as initial values. However, a fault narrowing down processing time which will be hereinafter described can be reduced if fan-in tracing is performed from each of outputs, which have been determined to be errors by expected value comparison by an LSI tester to an input of the LSI or a scanning flip-flop and those gates which are included in the range of tracing from all error outputs are set as candidates for a suspected fault gate, as is performed by an ordinary fault diagnosis system. Further, where the present fault diagnosis apparatus is used in combination with a conventional fault diagnosis apparatus which is directed to a single stuck-at fault, the processing time can be further reduced if the present fault diagnosis apparatus is used only for those faults which cannot be narrowed down by the conventional fault diagnosis apparatus. For example, from among those disconnection faults intermediate of wiring lines which can be narrowed down by the present fault diagnosis apparatus, those faults intermediate of wiring lines having no branch, which are faults equivalent to single stuck-at faults, and those faults intermediate of branch wiring lines after branching into two branches are excepted, but only those gates having three or more branch wiring lines are set as suspected fault gates. This setting can reduce the number of gates of an object of processing significantly.

The indefinite value simulation narrowing down section 2, output value check narrowing down section 3 and branch destination fault simulation narrowing down section 4 function to narrow down suspected fault gates. In the present fault diagnosis apparatus, for the suspected fault gate set 11 initially set by the suspected fault gate setting section 1, narrowing down is performed first by the indefinite value simulation narrowing down section 2. Then, for the suspected fault gate set 11 thus narrowed down, further narrowing down is performed by the output value check narrowing down section 3. Finally, for the suspected fault gate set 11 narrowed down in this manner, narrowing down is performed by the branch destination fault simulation narrowing down section 4.

The indefinite value simulation narrowing down section 2 uses the test pattern 12 to perform, for each of the gates in the suspected fault gate set 11 initially set by the suspected fault gate setting section 1, a simulation wherein the output value of the gate is set to an indefinite value, and outputs those gates whose outputs have been determined to be errors by expected value comparison by the LSI tester and exhibit indefinite values to the suspected fault gate set 13 whereas it does not output any suspected fault gate whose outputs have been determined to be errors and any of whose outputs exhibits a definite value to the suspected fault gate set 13. At a point of time when the processing of the output value check narrowing down section 3 is completed, the suspected fault gate set 11 is cleared, and the stored contents of the suspected fault gate set 13 are transferred as suspected fault gate candidates for succeeding narrowing down to the suspected fault gate set 11. The simulations which are performed with the output values of the gates set to indefinite values allow high speed processing of all suspected fault gates by performing fault simulations with indefinite values set in place of 0/1 as fault values by a concurrent fault simulation method in place of performing a logic simulation for one after another of the gates.

The output value check narrowing down section 3 performs a logic simulation using the test pattern 12 to determine output values of the gates in the suspected fault gate set 11 of those test patterns which have been determined to be errors by expected value comparison by an LSI tester. Then, for all test patterns which have been determined to be errors, the output value check narrowing down section 3 checks whether or not the output values of the gates are same, and outputs those gates whose output values are same to the suspected fault gate set 13 whereas it does not output those gates whose output values are not same to the suspected fault gate set 13. At a point of time when the processing of the output value check narrowing down section 3 is completed, the suspected fault gate set 11 is cleared, and the contents of the suspected fault gate set 13 are transferred as suspected fault gate candidates for succeeding narrowing down to the suspected fault gate set 11.

The branch destination fault simulation narrowing down section 4 defines 0/1 stuck-at faults to output branch designations of the gates in the suspected fault gate set 11 and performs a logic simulation using the test pattern 12 to determine at which outputs the individual faults are detected. Then, the branch destination fault simulation narrowing down section 4 outputs each gate which has a branch destination fault which is detected at those outputs which have been determined to be errors but is not detected at those outputs which have not been determined to be errors to the suspected fault gate set 13, but does not output each suspected fault gate which does not have any output branch destination fault which is not detected at normal outputs but is detected at error outputs to the suspected fault gate set 13.

The result display section 5 receives the suspected fault gate set 13 in which results of narrowing down by the individual narrowing down sections 2, 3 and 4 are stored or a final result of narrowing down by all of the narrowing down sections 2, 3 and 4 is stored, and outputs names of gates, net names of outputs of the gates, coordinates of the gates on a layout and so forth of the suspected fault gate set 13 as a suspected fault list 14.

Final confirmation of a fault site is performed by the fault site confirmation section 6. In particular, the fault site confirmation section 6 sets, based on the suspected fault list 14, points upon which an electron beam (EB) is to be irradiated to observe signals, and drives a signal line to be observed using a test pattern for observation to perform observation by an EB tester. Since a fault is estimated to be a disconnection intermediate of a branch wiring line based on a result of a diagnosis, an output point of a suspected fault gate and an end point of a branch destination are set as observation sites to be observed. Such setting allows reliable confirmation of a fault site.

Subsequently, detailed operation of the indefinite value simulation narrowing down section 2, output value check narrowing down section 3 and branch destination fault simulation narrowing down section 4 which are principal components of the fault diagnosis apparatus of the present embodiment is described with reference to FIGS. 2 to 4.

Figure 2:
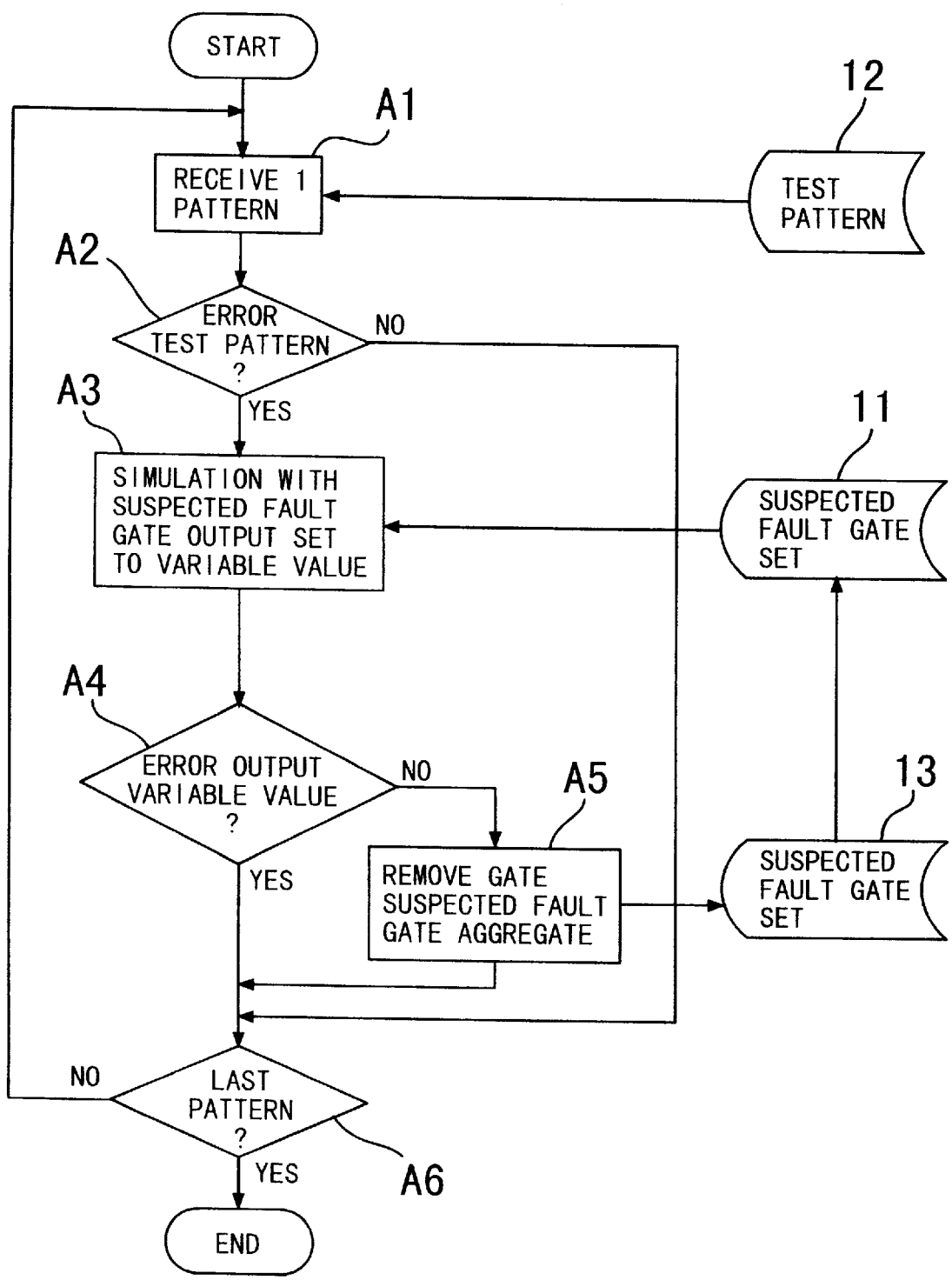
FIG. 2 is a flow chart illustrating an example of processing of an indefinite value simulation narrowing down section of the fault diagnosis apparatus of FIG. 1.

Referring first to FIG. 2, there is illustrated in flow chart an example of operation of the indefinite value simulation narrowing down section 2. The indefinite value simulation narrowing down section 2 receives one pattern as an input thereto from the test pattern 12 (step A1) and discriminates whether or not the pattern is one of patterns which have been determined to be errors by expected value comparison by an LSI tester (is a pattern which exhibits an error output) (step A2). If the pattern is an error test pattern, then the output value check narrowing down section 3 performs fault narrowing down processing insteps A3 to A5, but if the pattern is not an error test pattern, then the indefinite value simulation narrowing down section 2 advances its process to step A6 so that a next pattern may be processed subsequently.

When the inputted pattern is an error test pattern, the indefinite value simulation narrowing down section 2 sets outputs of the gates of the suspected fault gate set 11 to indefinite values to perform a simulation using a test pattern which has been determined to be the error test pattern to discriminate whether or not any of outputs of the circuit exhibits an indefinite value (step A3). Then, the indefinite value simulation narrowing down section 2 discriminates, for each of the suspected fault gates, whether or not outputs which have been determined to be errors with the test pattern exhibit an indefinite value when the output of the suspected fault gate is set to an indefinite value (step A4). If any of the outputs which have been determined to be errors exhibits an indefinite value, then the indefinite value simulation narrowing down section 2 removes the suspected fault gate from the suspected fault gate set 13 (step A5).

The fact that an error output is not an indefinite value but a definite value in step A4 signifies that, irrespective of whether the output value of the suspected fault gate is 0 or 1, this does not have an influence on the output value and hence that, even if the suspected fault gate is faulty, a definite value (normal value) is outputted as the output. Since this is inconsistent with the fact that the output has been determined to be an error by expected value comparison by a tester, if an indefinite value simulation reveals that the error output is not an indefinite value, it is determined that the gate is not a fault gate, and the gate is deleted from the suspected fault gate list as described above. Further, since such discrimination is performed only for error outputs in this manner, any test pattern which has no error output need not be processed. This is the reason why an indefinite value simulation and discrimination processing are omitted for any pattern which is discriminated not to be an error test pattern in step A2.

The suspected fault gate set 13 is initially the same as the suspected fault gate set 11, but those gates which are determined not to be suspected fault gates are successively removed from the suspected fault gate set 13. When the processing is completed for one pattern and processing is to be started for a next pattern, the contents of the suspected fault gate set 13 are returned to the suspected fault gate set 11 so that a gate removed once may not be processed later.

It is to be noted that, while the suspected fault gate set 11 and the suspected fault gate set 13 are illustrated as separate data in FIG. 1 for the convenience of illustration and description, they can be processed as a single set if a list or table of suspected fault gates is stored in a memory of a computer, and a suspected fault gate is removed from the list or table in step A5 and then, in steps A3 and A4, an indefinite value simulation and a result discrimination are performed for suspected fault gates which remain in the list or table.

Figure 3:
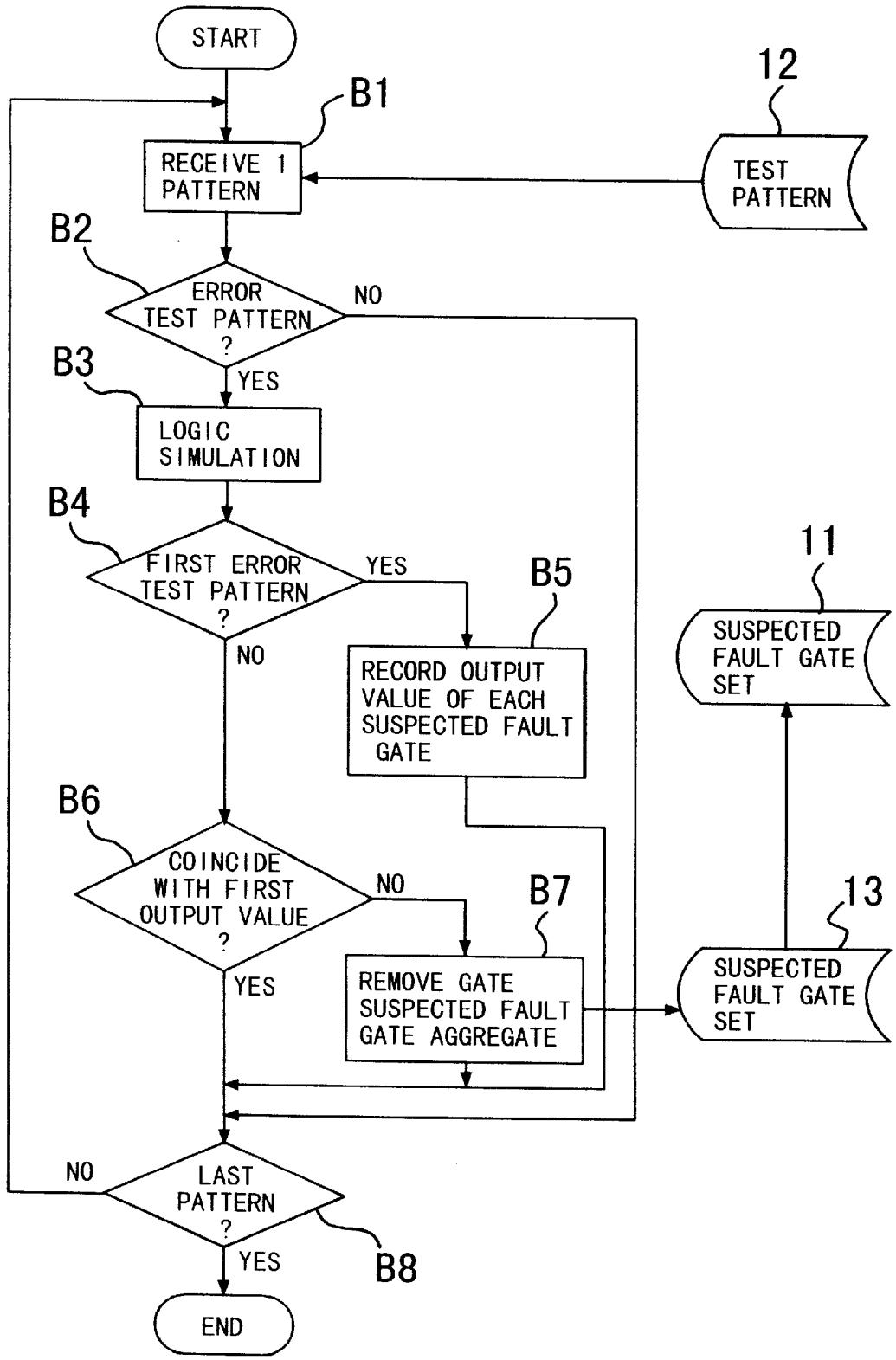
FIG. 3 is a flow chart illustrating an example of processing of an output value check narrowing down section of the fault diagnosis apparatus of FIG. 1.

Referring now to FIG. 3, there is illustrated in flow chart an example of operation of the output value check narrowing down section 3. The output value check narrowing down section 3 receives one pattern from the test pattern 12 (step B1) and discriminates whether or not the pattern is one of the patterns (error test patterns) which have been determined to be errors by the expected value comparison by the LSI tester (step B2). If the inputted pattern is an error test pattern, then the output value check narrowing down section 3 performs fault narrowing down processing in steps B3 to B7, but if the inputted pattern is not an error test pattern, then the output value check narrowing down section 3 advances its process to step B8 so that processing for a next pattern may be performed later.

If the inputted pattern is an error test pattern, then a logic simulation is performed using the test pattern which is the error test pattern to determine output values of the gates of the suspected fault gate set 11 (step B3). Then, the output value check narrowing down section 3 discriminates whether or not the inputted pattern is the first pattern (step B4). If the inputted pattern is the first pattern, then the output value check narrowing down section 3 records the output values of the suspected fault gates of a result of the logic simulation (step B5), but if the inputted pattern is the second or following pattern, then the output value check narrowing down section 3 compares the output values of the suspected fault gates of the recorded result of the first logic simulation with the output values of the individual gates (step B6) and removes those gates which do not exhibit coincidence with the output values of the first logic simulation from the suspected fault gate set 13 (step B7). While, also in FIG. 3, the suspected fault gate set 11 in which data to be inputted are stored and the suspected fault gate set 13 into which results are to be stored are illustrated separately from each other for the convenience of illustration and description, they can be processed as a single set if a list or table of suspected fault gates is stored in the memory of the computer and, in step B6, for the suspected fault gates in the list or table, output values of a logic simulation result are compared to effect discrimination, and then in step B7, pertaining suspected fault gates are removed from the list or table.

The fact that the output value of a suspected fault gate does not coincide with the output value with regard to the first error test pattern in step B6 signifies that the output value of the suspected fault gate is an error not only when it is 0 but also when it is 1. It is considered that, because of a disconnection fault, the signal line following the disconnection site does not exhibit a variation and is logically fixed to 0 or 1. Accordingly, when the output value of the gate is one of 0 and 1, it exhibits coincidence with the fixed value arising from the fault, and in this instance, since all signal values are same as normal values, they must exhibit no error. This is inconsistent with the result of the expected value comparison by the LSI tester. Accordingly, when the output value of a suspected fault gate of an error test pattern exhibits the two values of 0 and 1, it can be determined that the gate is not a fault gate and can be deleted from the suspected fault gate list or table. On the other hand, even if the output value of the suspected fault gate and the fixed value arising from the fault are different from each other, if the influence of the fault is not transmitted to the output of the circuit, then this does not make an error of the circuit. Accordingly, whichever one of 0 and 1 the output value of the suspected fault gate is, no inconsistency occurs with a test pattern which does not exhibit an error, and therefore, a logic simulation and an output value discrimination process are not performed based on a discrimination in step B2.

Figure 4:
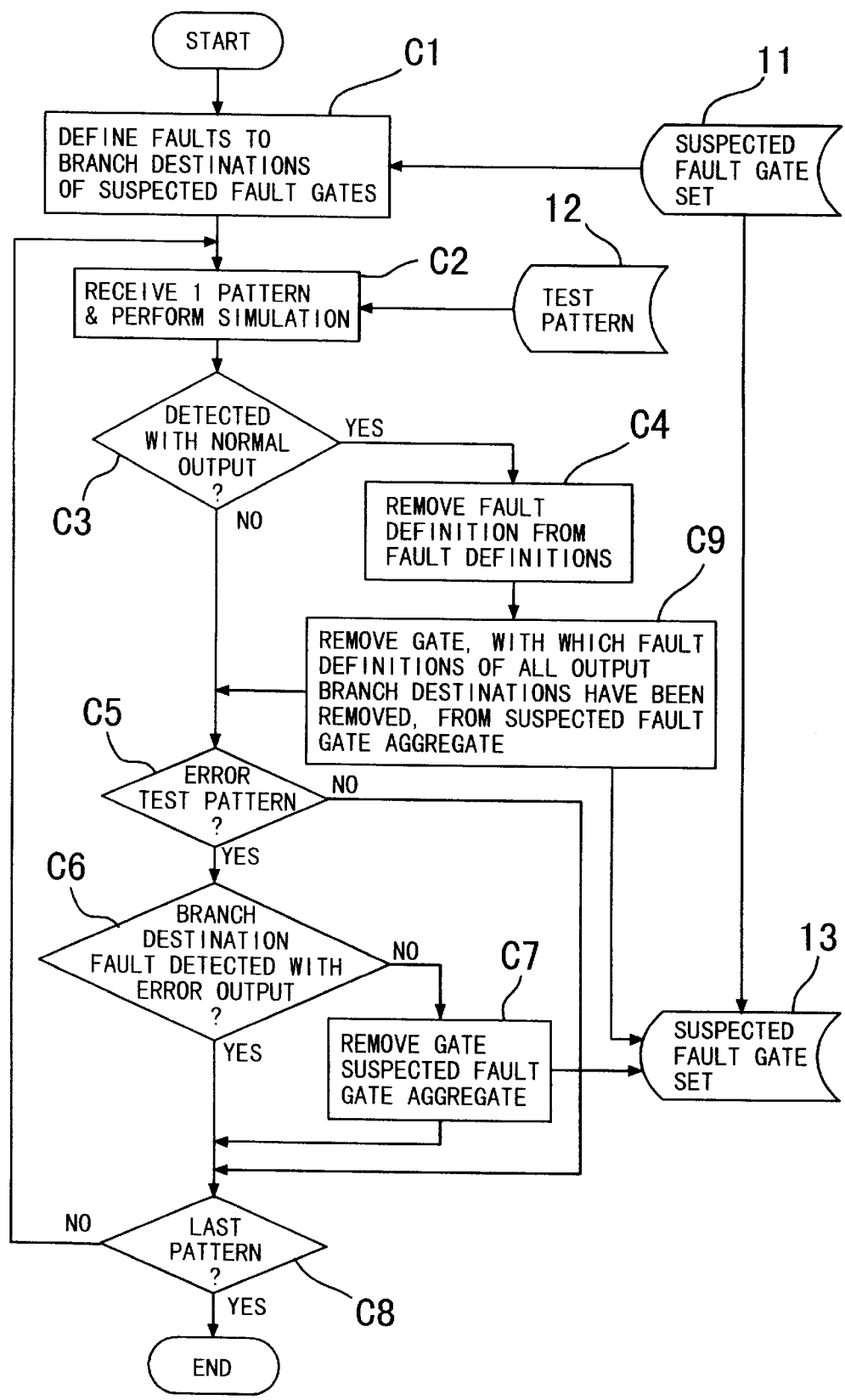
FIG. 4 is a flow chart illustrating an example of processing of a branch destination fault simulation narrowing down section of the fault diagnosis apparatus of FIG. 1.

FIG. 4 illustrates in flow chart an example of operation of the branch destination fault simulation narrowing down section 4. Prior to processing of the branch destination fault simulation narrowing down section 4, stored contents of the suspected fault gate set 11 are transferred to the suspected fault gate set 13. The branch destination fault simulation narrowing down section 4 first defines 0/1 stuck-at faults to output destinations of the gates in the suspected fault gate set 11 (step C1). Then, the branch destination fault simulation narrowing down section 4 receives one pattern as an input thereto from the test pattern 12 and performs a fault simulation to determine at which outputs the individual definition faults are detected (step C2). Then, the branch destination fault simulation narrowing down section 4 discriminates, for all of the defined faults, whether or not each defined fault is detected at normal outputs which exhibit no error (step C3). If the discrimination is affirmative, then the branch destination fault simulation narrowing down section 4 deletes the fault from the fault definitions (step C4). If such deletion yields a suspected fault gate from which fault definitions of all output destinations have been removed, then the branch destination fault simulation narrowing down section 4 removes the suspected fault gate from the suspected fault gate set 13 (step C9). Then, the branch destination fault simulation narrowing down section 4 discriminates whether or not the pattern in question is an error test pattern (step C5), and if the pattern is an error test pattern, then the branch destination fault simulation narrowing down section 4 checks, for each suspected fault gate, whether or not there is a destination fault which is detected with an error output of the suspected fault gate (step C6). If none of the definition faults of the output designations are detected with the error outputs, then the branch destination fault simulation narrowing down section 4 removes the suspected fault gate from the suspected fault gate set 13 (step C7). The operations in steps C2 to C7 and C9 described above are repeated for all patterns.

It is considered that a fault which is detected with a normal output in step C3 does not exist actually. Even if a fault is present intermediately of a branch, since a signal which branches forwardly of the fault site operates normally, a fault of the normal branch destination may possibly be detected at a normal output. Therefore, a fault which is detected at a normal output is removed from the fault definitions (step C4). Then, a suspected fault gate from which fault definitions of all output branch destinations have been removed is removed from the suspected fault gate set 13 since it is not possibly a fault gate.

If a branch destination fault is detected with an error output in step C6, there is the possibility that the fault may be a cause of an error. However, if none of definition faults of branch destinations are detected with an error output, then the error of the error test pattern cannot be explained, and it is considered that a fault is at some other site. Therefore, the gate is removed from the suspected fault gate set (step C7). It is to be noted that, since it is considered that, with a disconnection fault intermediate of an output wiring line, a plurality of branch destinations of the same gate may exhibit fault values simultaneously, one output with which a fault is detected need not coincide with all error outputs.

In the following, different working examples of the fault diagnosis apparatus of the embodiment described above are described.

Figure 5A:
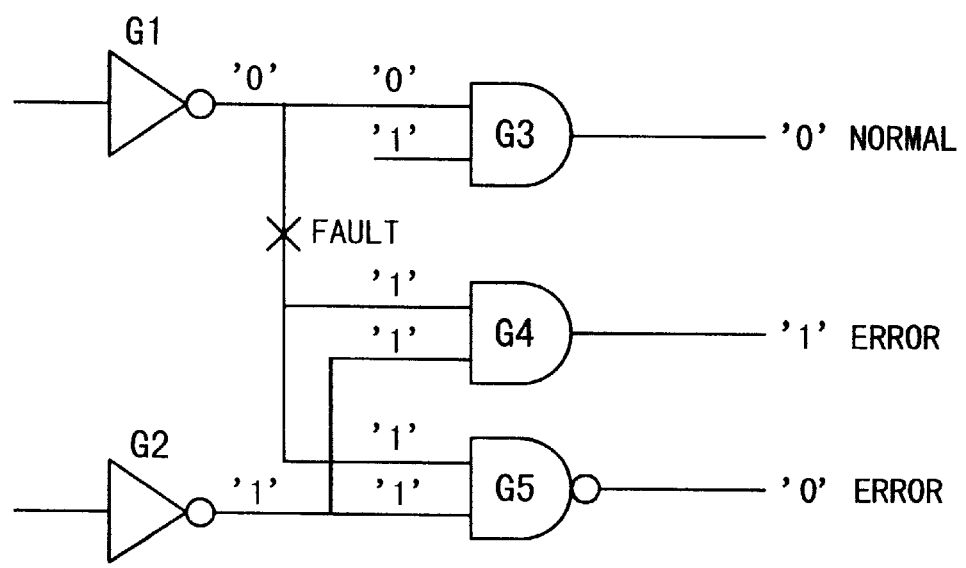
FIGS. 5(a) to 5(d) are block diagrams showing an example of a circuit which makes an object of a fault diagnosis, and a result of an indefinite value simulation and a result of a single stuck-at fault simulation performed for the circuit.

FIG. 5(a) shows an example of a circuit which includes a fault. Referring to FIG. 5(a), an output wiring line of a gate G1 intermediately has a fault, and the wiring line segment rearwardly of the fault site is fixed to "1". As a result, the outputs of gates G4 and G5 becomes errors which are different from expected values. Meanwhile, the wiring line segment forwardly of the fault site is normal, and the output of a gate G3 is normal. A narrowing down procedure when the indefinite value simulation narrowing down section 2 (refer to FIGS. 1 and 2) is used for the circuit of FIG. 5(a) is described below.

Figure 5B:
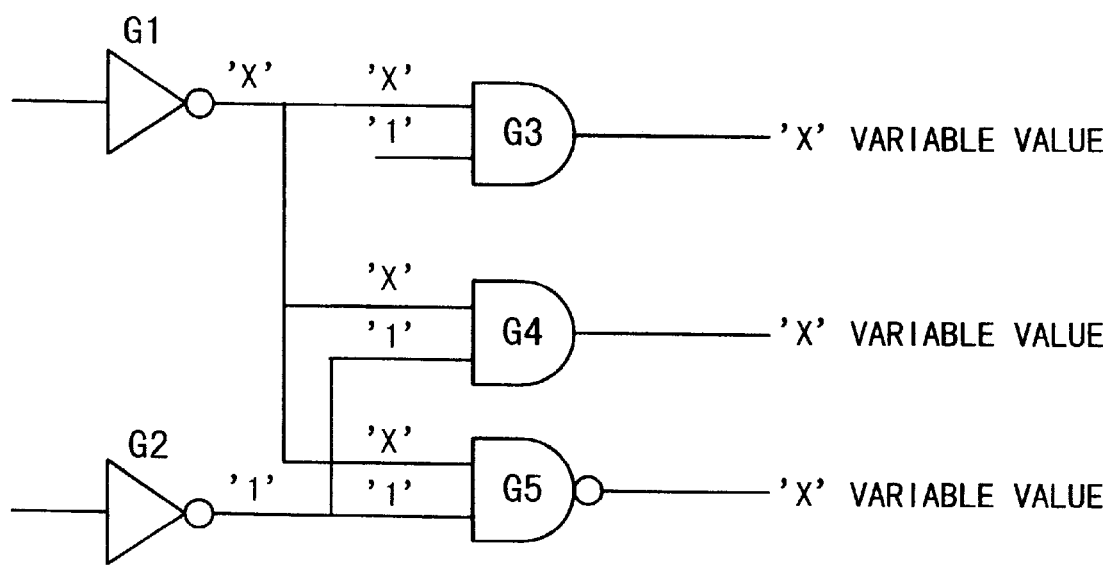

FIG. 5(b) illustrates a result of a simulation which is performed with the output of the gate G1 set to an indefinite value 'X' (the output of a gate G2 is the same as in FIG. 5(a)). In this instance, all of the outputs of the gates G3 to G5 exhibit the indefinite value 'X'. If no indefinite value is outputted from all error outputs, then the gate is removed from the suspected fault gate list or table as seen from steps A4 and A5 of FIG. 2. However, since both of the outputs of the error gates which have been determined to be errors have indefinite values, the gate G1 remains as a suspected fault gate.

Figure 5C:
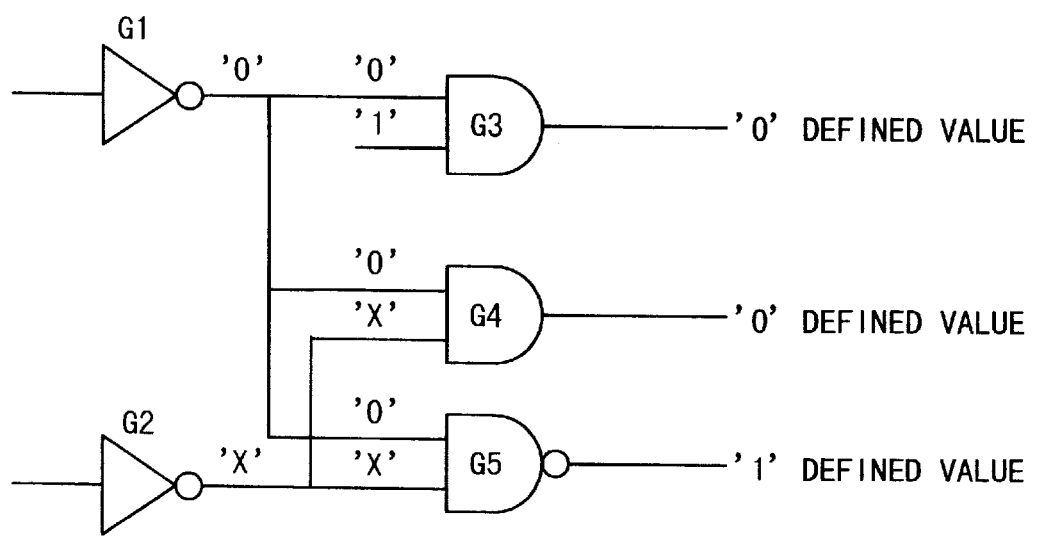

FIG. 5(c) illustrates a result of a simulation which is performed with the output of the gate G2 set to the indefinite value 'X' (the output of the gate G1 is the same as in FIG. 5(a)). In this instance, all of the outputs of the gates G3 to G5 exhibit the indefinite value 'X'. As a result, since no indefinite value is outputted from all of the outputs of the gates G4 and G5 which have been determined to be errors, the gate G2 is deleted from the suspected fault gate list or table. Similarly, if the output of the gate G3 is set to the indefinite value 'X', then the outputs of the gates G4 and G5 which have been determined to be errors exhibit definite values, but if the output of the gate G4 is set to an indefinite value, then the output of the gate G5 which has been determined to be an error exhibits an indefinite value. Further, when the output of the gate G5 is set to an indefinite value, the output of the gate G4 which has been determined to be an error exhibits a definite value. Thus, all of the gates G3 to G5 are removed from the suspected fault gate list or table. Consequently, only the gate G1 finally remains as a suspected fault gate, resulting in success in narrowing down of the fault sites.

Figure 5D:
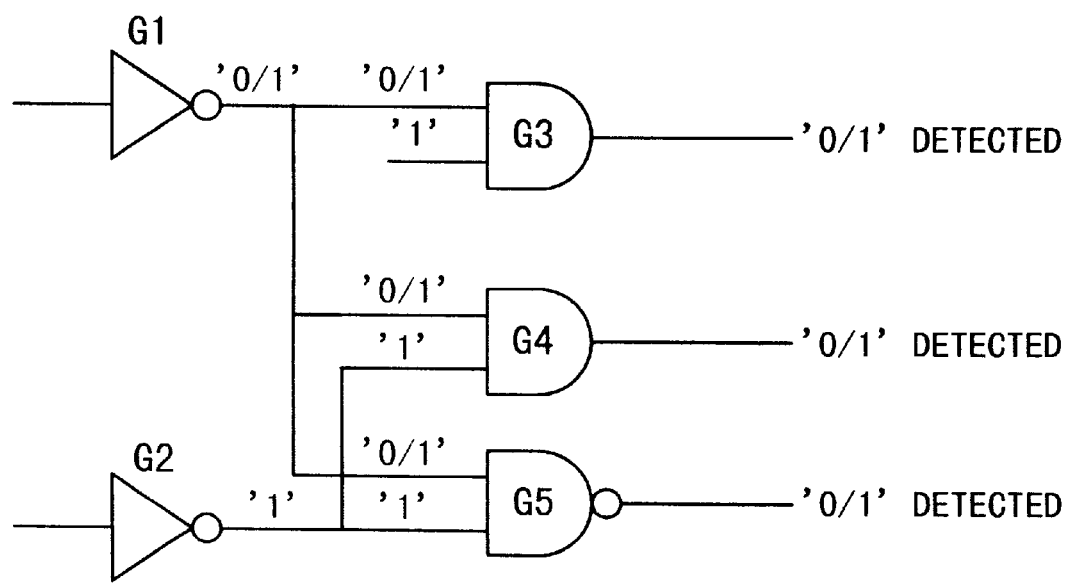

FIG. 5(d) shows an example of a conventional fault diagnosis which is based on a single stuck-at fault model. A 1 stuck-at fault of the output of the gate G1 is detected at all of the outputs of the gates G3, G4 and G5. With a conventional technique, since the 1 stuck-at fault is detected at the output of the gate G3 which has not been determined to be an error, this fault is considered to be inconsistent. Similarly, all of the other stuck-at faults are inconsistent with outputs of pertaining gates which have been determined to be errors, resulting in failure of the diagnosis of the fault site. In this manner, the indefinite value simulation narrowing down section 2 can correctly diagnose such fault candidates which cannot be narrowed down by a conventional technique.

Figure 6A:
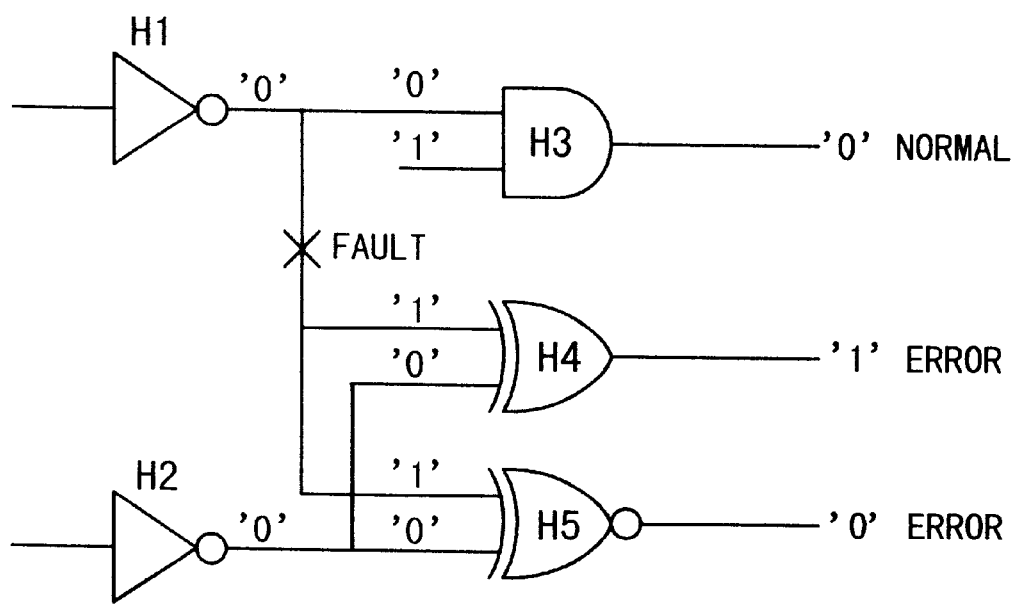
FIGS. 6(a) and 6(b) are block diagrams showing another example of a circuit which makes an object of a fault diagnosis and illustrating narrowing down by the output value check narrowing down section of the fault diagnosis apparatus of FIG. 1.
Figure 6B:
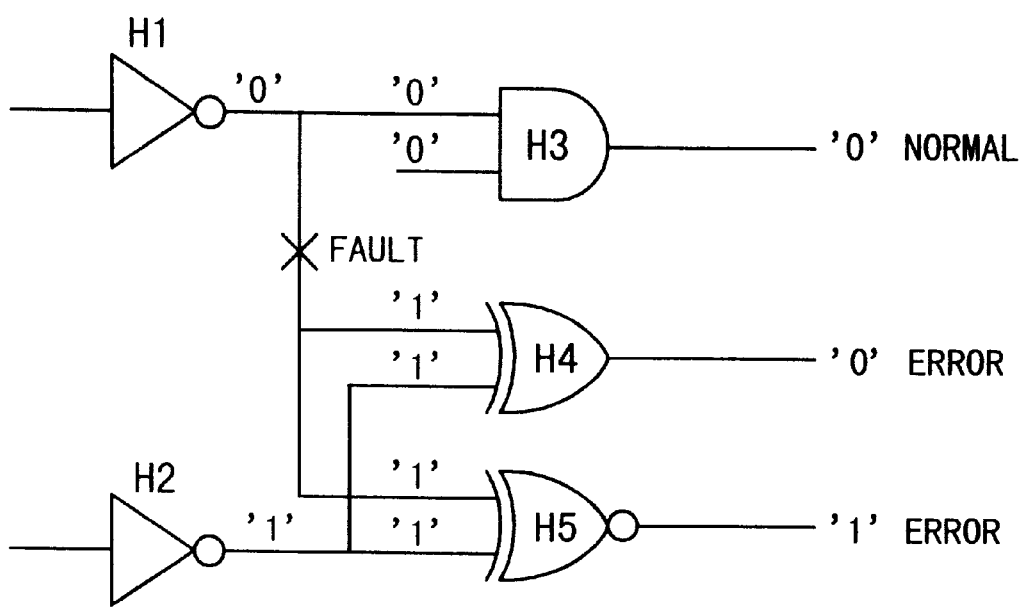

FIG. 6(a) shows another example of a circuit which includes a fault. An output wiring line of a gate H1 has an intermediate fault, and the wiring line segment rearwardly of the fault site is fixed to '1', and as a result, the outputs of gates H4 and H5 exhibit errors which are different from respective expected values. FIGS. 6(a) and 6(b) illustrate results when different test patterns are applied for the same fault circuit. A narrowing down procedure where the output value check narrowing down section 3 (refer to FIGS. 1 and 3) is used for the circuit is described below.

First, a logic simulation is performed with the first test pattern shown in FIG. 6(a). In this instance, the outputs of the gates H1 to H5 are 0, 0, 0, 1 and 0, respectively. Then, a logic simulation is performed with the second test pattern shown in FIG. 6(b), and output values of the gates then are compared with the values obtained with the first test pattern and any gate with which the two values do not coincide with each other is removed from the suspected fault gate list or table. In the logic simulation with the second test pattern, the outputs of the gates H1 to H5 are 0, 1, 0, 0 and 1, respectively. As a result, the gates H1 and H3 are left because they exhibit equal values, but the gates H2, H4 and H5 are removed from the suspected fault gate list or table because the output values of them are 1, 0 and 1 which are different from the output values 0, 1 and 0 based on the first test pattern. If any additional test pattern is available, the procedure described above is repeated with the pattern to further narrow down suspected fault gates. It is to be noted that, while the two gates H1 and H3 remain as suspected fault gates as a result of the procedures with the two patterns described above, where some other fault narrowing down section such as, for example, the indefinite value simulation narrowing down section 2 described hereinabove with reference to FIGS. 1 and 2 is used together, the gate H3 is removed from the suspected fault gate list or table and only the gate H1 which actually has a fault is outputted as a fault diagnosis result.

Figure 7A:
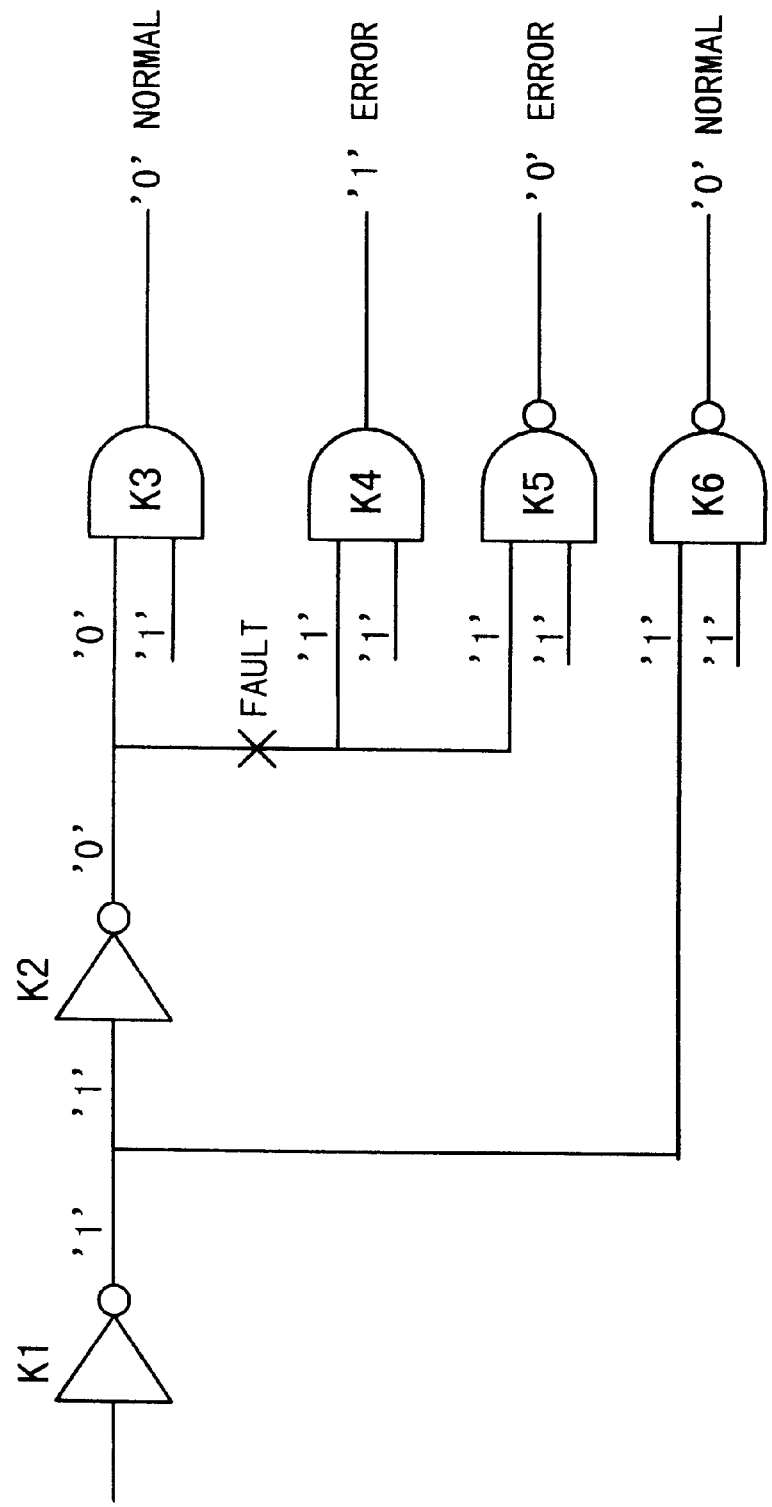
FIGS. 7(a) to 7(c) are block diagrams showing a further example of a circuit which makes an object of a fault diagnosis and results of branch destination fault simulations performed for the circuit, respectively.
Figure 7:
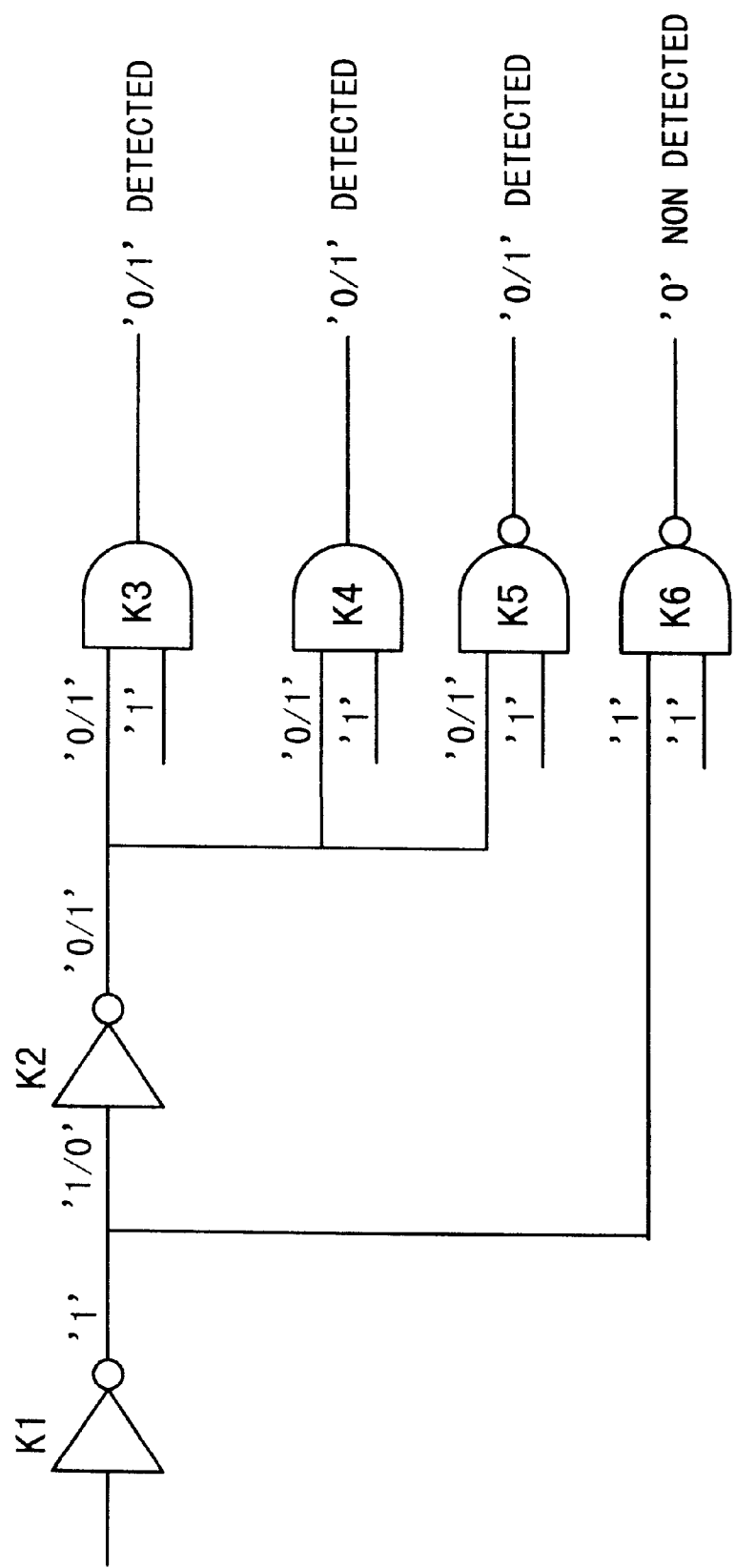

FIG. 7(a) shows a further example of a circuit which includes a fault. An output wiring line of a gate K2 has a intermediate fault, and the wiring line segment rearwardly of the fault site is fixed to '1'. As a result, the outputs of gates K4 and K5 exhibit errors which are different from expected values. A narrowing down procedure where the branch destination fault simulation narrowing down section 4 (refer to FIGS. 1 and 4) is used for the circuit is described.

FIG. 7(b) shows a result of a fault simulation performed for a 0 stuck-at fault of one of branch destinations of an output wiring line of the gate K1 which is inputted to the gate K2. This fault is detected at the outputs of the gates K3, K4 and K5. Of the outputs, the output of the gate K3 is normal. Consequently, the gate K3 is deleted from the fault definitions by steps C3 and C4 of FIG. 4. Similarly, since also the 0 stuck-at fault of a wiring line segment of one of the branch destinations of an output wiring line of the gate K1 which is inputted to the gate K6 is detected at the output of the gate K6 which is normal, the gate K1 is deleted from the fault definitions by steps C3 and C4 of FIG. 4. Since the output value of the gate K1 is '1', a "1" stuck-at fault from among branch destination faults of the output wiring line of the gate K1 is not detected at any output. In particular, in step C6 of FIG. 4, the discrimination regarding the gate K6 is NO. As a result of the foregoing, the branch destination faults of the output wiring line of the gate K1 do not include any fault which is not detected at a normal output and is detected at an error output, and consequently, the gate K1 is removed from the suspected fault gate set 13 by step C7 of FIG. 4.

Figure 7C:
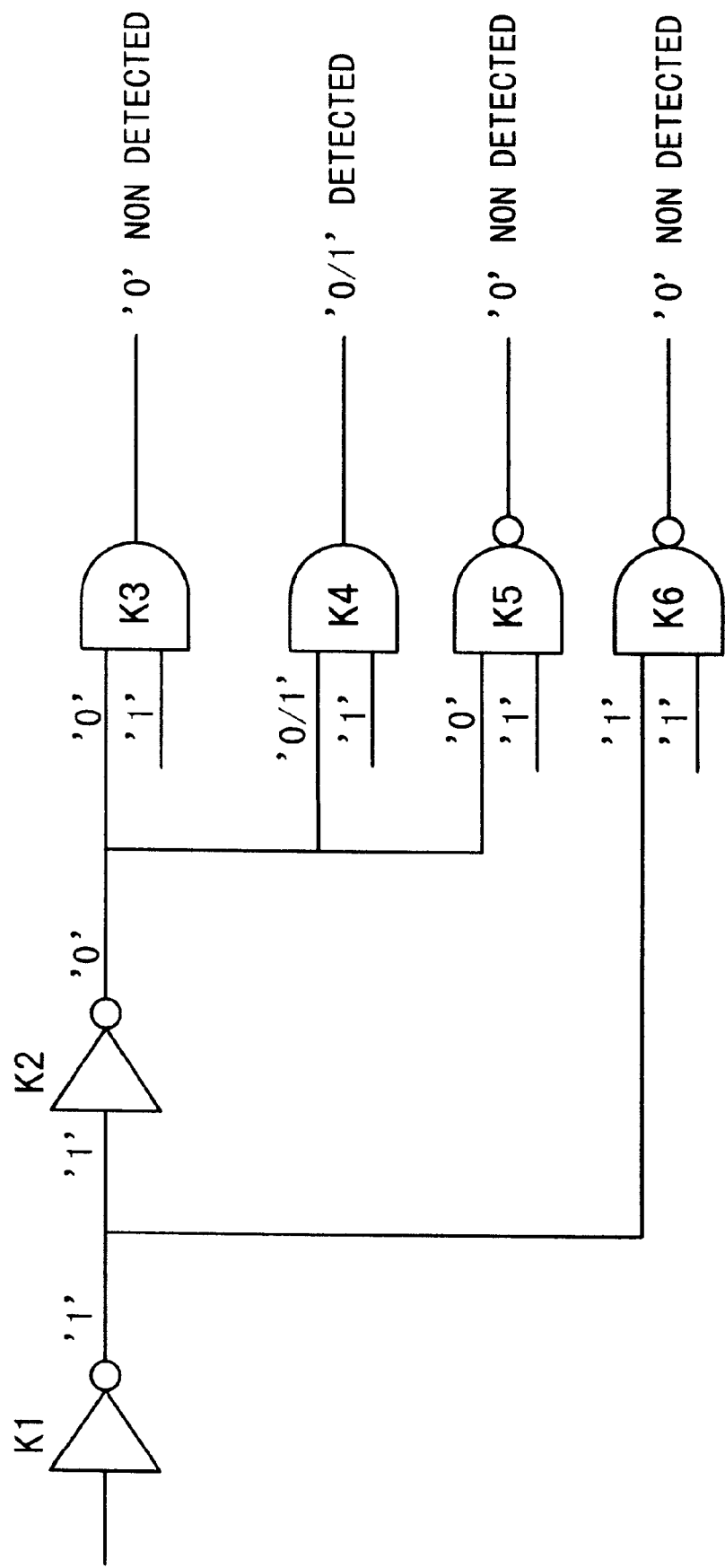

On the other hand, a 1 stuck-at fault of a wiring line segment of one of branch destination faults of the output wiring line of the gate K2 which is inputted to the gate K4 is detected only at the output of the gate K4 which has been determined to be an error as seen from FIG. 7(c), but is not detected at any normal output. As a result, the gate K2 is not removed from the suspected fault gate set 13 by step C7 of FIG. 4 and, as a result, remains as a suspected fault gate. Fault site candidates can be narrowed down precisely in this manner.

Figure 8A:
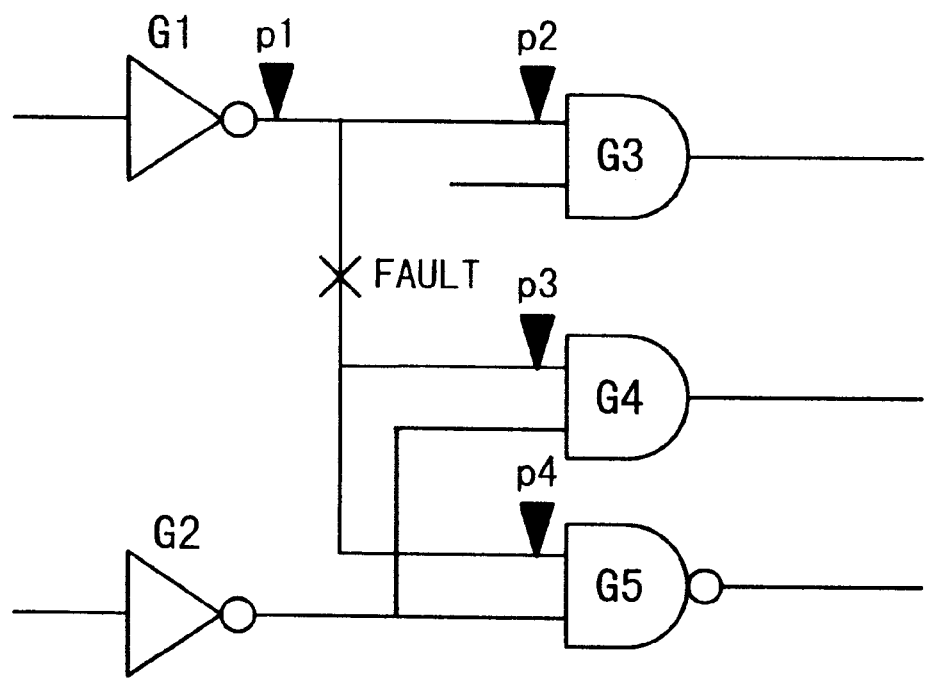
FIGS. 8(a) and 8(b) are a block diagram showing an example of observation points on an EB tester by a fault site confirmation section of the fault diagnosis apparatus of FIG. 1 and an example of waveforms observed on the EB tester, respectively.
Figure 8B:
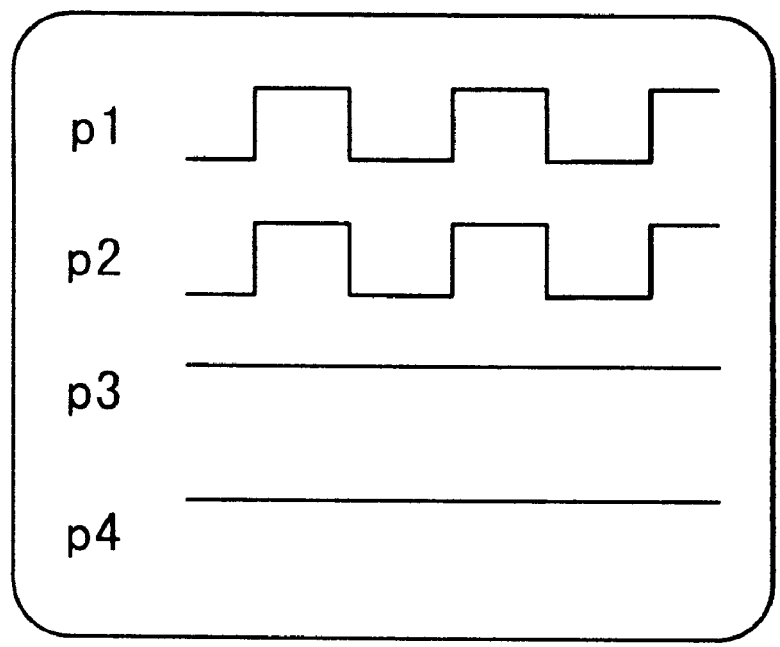

Subsequently, a working example of the fault site confirmation section 6 described hereinabove with reference to FIG. 1 is described with reference to FIGS. 8(a) and 8(b). FIG. 8(a) shows points to be observed by means of an EB tester in order to confirm a fault site in a result of fault narrowing down for the circuit of FIGS. 5(a) to 5(d). Observation points are set to the output point p1 of the gate G1 and end points p2, p3 and p4 of branch destinations narrowed down as suspected faults. Normally, prior to observation by means of an EB tester, such preparations as to remove an insulating film on wiring patterns of the LSI so as to facilitate observation of the observation points or to open holes for observation to wiring lines at the observation points by means of a focused ion beam. FIG. 8(b) shows an example of observed waveforms by an EB tester. Although one site can normally be observed at a time, observed waveforms are stored into the computer so that observed waveforms at a plurality of sites can be displayed simultaneously so as to allow comparison among them. From the results of observation shown in FIG. 8(b), it can be seen that the observation points p1 and p2 are normal, but the observation points p3 and p4 exhibit fixed signals due to a fault. As a result, it can be diagnosed from a layout diagram or the like that the output wiring line of the gate G1 suffers from a disconnection at an intermediate portion thereof after branching to the observation point P2 and forwardly to the branching point to the observation points p3 and p4.

Figure 9:
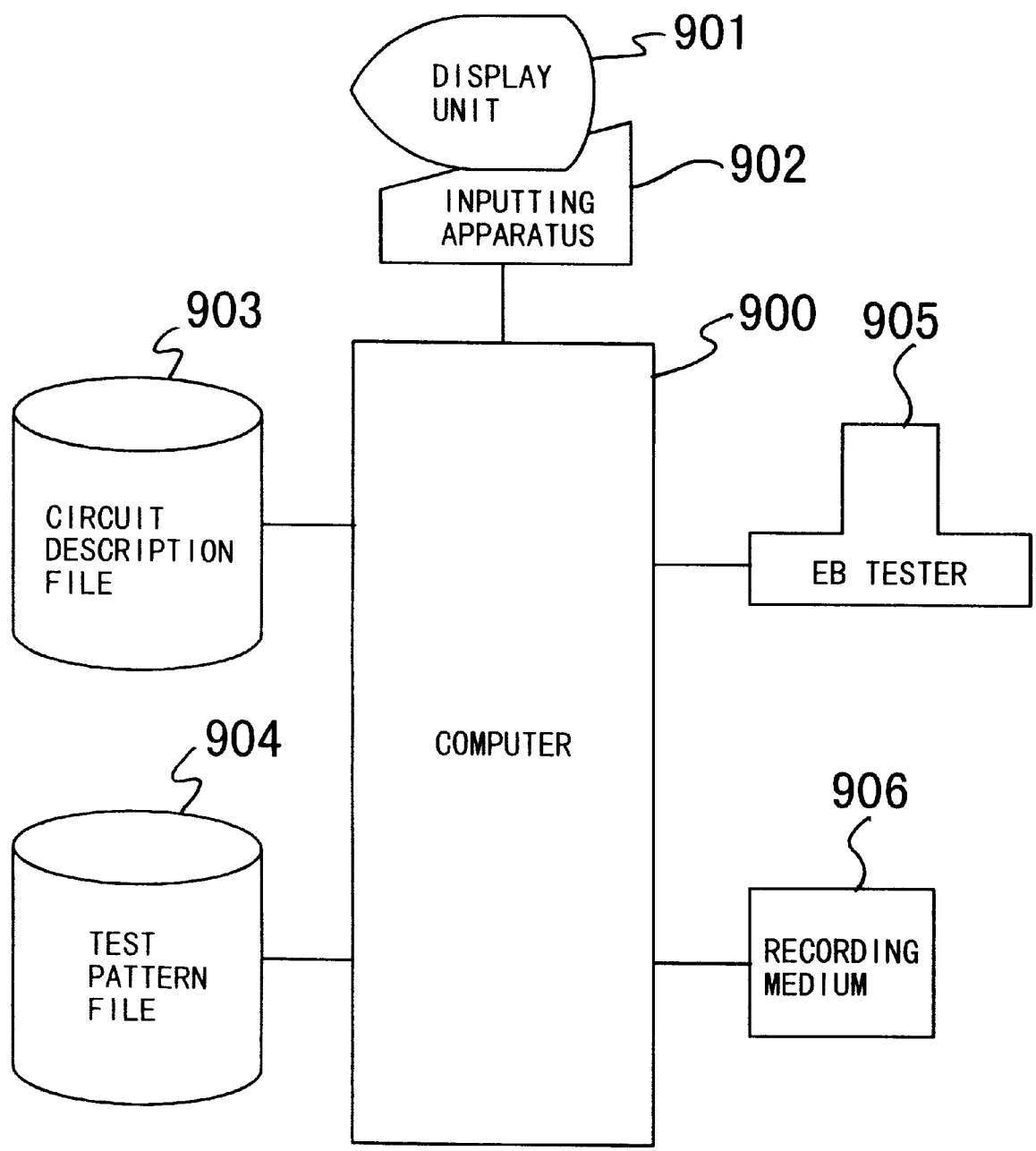
FIG. 9 is a block diagram of another fault diagnosis apparatus to which the present invention is applied.

FIG. 9 shows another fault diagnosis apparatus to which the present invention is applied. Referring to FIG. 9, the fault diagnosis apparatus shown includes a computer 900, a display unit 901, an inputting apparatus 902, a circuit description file 903 in which a circuit description similar to the circuit description 10 of FIG. 1 is stored, a test pattern file 904 in which a test pattern similar to the test pattern of FIG. 1 is stored, an EB tester 905, and a recording medium 906. The recording medium 906 is a machine-readable recording medium such as a CD-ROM, a magneto-optical disk or a semiconductor memory, and has a fault diagnosis program recorded thereon. The fault diagnosis program recorded on the recording medium 906 is read by the computer 900 and controls operation of the computer 900 so that the computer 900 may perform such processing of the suspected fault gate setting section 1, indefinite value simulation narrowing down section 2, output value check narrowing down section 3, branch destination fault simulation narrowing down section 4, result display section 5 and fault site confirmation section 6 as described hereinabove with reference to FIG. 1.

It is to be noted that, while the narrowing down sections 2, 3 and 4 of the fault diagnosis apparatus described hereinabove with reference to FIG. 1 are applied in the order of the indefinite value simulation narrowing down section 2→output value check narrowing down section 3→branch destination fault simulation narrowing down section 4, the order of application of them is not limited to the specific one. For example, the branch destination fault simulation narrowing down section 4 may be applied next to the indefinite value simulation narrowing down section 2, whereafter the output value check narrowing down section 3 is applied, or the indefinite value simulation narrowing down section 2, output value check narrowing down section 3 and branch destination fault simulation narrowing down section 4 may be applied in any other arbitrary order. Further, while the fault diagnosis apparatus described hereinabove with reference to FIG. 1 includes three narrowing down sections, the fault diagnosis apparatus according to the present invention may include only the output value check narrowing down section 3, only the branch destination fault simulation narrowing down section 4, the output value check narrowing down section 3 and the branch destination fault simulation narrowing down section 4, the output value check narrowing down section 3 and the indefinite value simulation narrowing down section 2, or the branch destination fault simulation narrowing down section 4 and the indefinite value simulation narrowing down section 2.

While preferred embodiments of the present invention have been described using specific terms, such description is for illustrative purposes only, and it is to be understood that changes and variations may be made without departing from the spirit or scope of the following claims.

What is claimed is:

1. A fault diagnosis apparatus which estimates a fault site in a fault diagnosis object LSI based on a result of an LSI test performed using a test pattern for the LSI, comprising:
   suspected fault gate setting means for setting candidates for a suspected fault gate to a suspected fault gate set; and
   output value check narrowing down means for checking, for each of the suspected fault gates included in the suspected fault gate set, whether or not a condition is satisfied that an output value of the suspected fault gate at least in an error test pattern is different from that of the suspected fault gate in the other error test patterns, and removing those of the suspected fault gates with which the condition is satisfied from the suspected fault gate set.

2. A fault diagnosis apparatus as claimed in claim 1, further comprising indefinite value simulation narrowing down means for performing, for each of the suspected fault gates included in the suspected fault gate set, a simulation in which an error test pattern is used and an output of the suspected fault gate is set to an indefinite value and removing any of the suspected fault gates with which at least one of those outputs which have been determined to be errors with the error test pattern exhibits a definite value from the suspected fault gate set.

3. A fault diagnosis apparatus as claimed in claim 2, wherein, for the suspected fault gate set after narrowing down of candidates for the suspected fault gate by said indefinite value simulation narrowing down means is performed, narrowing down of the candidates for the suspected fault gate by said output value check narrowing down means is performed.

4. A fault diagnosis apparatus as claimed in claim 1, wherein said suspected fault gate setting means sets only those gates whose outputs are each branched into three or more branches as the candidates for the suspected fault gate.

5. A fault diagnosis apparatus as claimed in claim 1, further comprising fault site confirmation means for observing, for those of the suspected fault gates included in the suspected fault gate set after narrowing down of the candidates for the suspected fault gate is performed, gate output points and end points of branch destinations of wiring line patterns of the outputs using an internal signal observation apparatus such as an electron beam tester to confirm a fault on the wiring pattern.

6. A fault diagnosis apparatus which estimates a fault site in a fault diagnosis object LSI based on a result of an LSI test performed using a test pattern for the LSI, comprising:

suspected fault gate setting means for setting candidates for a suspected fault gate to a suspected fault gate set; and branch destination fault simulation narrowing down means for defining a 1/0 stuck-at fault to each of output branch destinations of the suspected fault gates included in the suspected fault gate set and performing a fault simulation for each one test pattern, removing, for each fault simulation, the fault definitions of output branch destinations detected with normal outputs, and removing those of the suspected fault gates from which the fault definitions of all of the respective output branch destinations have been removed and those of the suspected fault gates with which, in any of the error test patterns, none of the fault definitions of the respective output branch destinations have not been detected with outputs which are determined to be errors with the error test pattern from the suspected fault gate set.

7. A fault diagnosis apparatus as claimed in claim 6, further comprising indefinite value simulation narrowing down means for performing, for each of the suspected fault gates included in the suspected fault gate set, a simulation in which an error test pattern is used and an output of the suspected fault gate is set to an indefinite value and removing any of the suspected fault gates with which at least one of those outputs which have been determined to be errors with the error test pattern exhibits a definite value from the suspected fault gate set.

8. A fault diagnosis apparatus as claimed in claim 7, wherein, for the suspected fault gate set after narrowing down of candidates for the suspected fault gate by said indefinite value simulation narrowing down means is performed, narrowing down of the candidates for the suspected fault gate by said branch destination fault simulation narrowing down means is performed.

9. A fault diagnosis apparatus as claimed in claim 6, wherein said suspected fault gate setting means sets only those gates whose outputs are each branched into three or more branches as the candidates for the suspected fault gate.

10. A fault diagnosis apparatus as claimed in claim 6, further comprising fault site confirmation means for observing, for those of the suspected fault gates included in the suspected fault gate set after narrowing down of the candidates for the suspected fault gate is performed, gate output points and end points of branch destinations of wiring line patterns of the outputs using an internal signal observation apparatus such as an electron beam tester to confirm a fault on the wiring pattern.

11. A recording medium having recorded thereon a fault diagnosis program for estimating a fault site in a fault diagnosis object LSI based on a result of an LSI test performed using a test pattern for the LSI, the fault diagnosis program causing a computer to execute:

a first step of setting candidates of a suspected fault gate to a suspected fault gate set; and a second step of checking, for each of the suspected fault gates included in the suspected fault gate set, whether or not a condition is satisfied that an output value of the suspected fault gate at least in an error test pattern is different from that of the suspected fault gate in the other error test patterns, and removing those of the suspected fault gates with which the condition is satisfied from the suspected fault gate set.

12. A recording medium as claimed in claim 11, wherein the second step includes:

(a) a step of receiving an error test pattern as an input, determining, for each of the suspected fault gates included in the suspected fault gate set, an output value of the suspected fault gate by a logic simulation performed by using the inputted error test pattern and recording the output value;

(b) a step of receiving another error test pattern as an input, determining, for each of the suspected fault gates included in the suspected fault gate set, an output value of the suspected fault gate by a logic simulation performed by using the inputted error test pattern, and removing the suspected fault gate from the suspected fault gate set if the output value of the suspected fault gate is different from the output value of the suspected fault gate recorded in the step (a); and (c) a step of repeating the steps (a) and (b) if a further error test pattern remains.

13. A recording medium as claimed in claim 11, wherein the fault diagnosis program causes the computer to execute a fourth step of performing, for each of the suspected fault gates included in the suspected fault gate set, a simulation in which an error test pattern is used an output of the suspected fault gate is set to an indefinite value and removing any of the suspected fault gates with which at least one of those outputs which have been determined to be errors with the error test pattern exhibits a definite value from the suspected fault gate set.

14. A recording medium as claimed in claim 13, wherein the fourth step includes:

(a) a step of receiving an error test pattern as an input and determining, for each of the suspected fault gates included in the suspected fault gate set, an output of the fault diagnosis object circuit by a logic simulation performed by using the inputted error test pattern with an output of the suspected fault gate set to an indefinite value;

(b) a step of removing any of the suspected fault gates with which at least one of those outputs which have been determined to be errors with the error test pattern exhibits a definite value from the suspected fault gate set; and (c) a step of repeating the steps (a) and (b) if another error test pattern remains.

15. A recording medium as claimed in claim 13, wherein, for the suspected fault gate set after narrowing down of candidates for the suspected fault gate by the fourth step is performed, narrowing down of the candidates for the suspected fault gate by the second step is performed.

16. A recording medium as claimed in claim 11, wherein, in the first step, only those gates whose outputs are each branched into three or more branches are set as the candidates for the suspected fault gate.

17. A recording medium as claimed in claim 11, wherein the fault diagnosis program causes the computer to execute a fifth step of observing, for those of the suspected fault gates included in the suspected fault gate set after narrowing down of the candidates for the suspected fault gate is performed, gate output points and end points of branch destinations of wiring line patterns of the outputs using an internal signal observation apparatus such as an electron beam tester to confirm a fault on the wiring pattern.

18. A recording medium having recorded thereon a fault diagnosis program for estimating a fault site in a fault diagnosis object LSI based on a result of an LSI test performed using a test pattern for the LSI, the fault diagnosis program causing a computer to execute:

a first step of setting candidates of a suspected fault gate to a suspected fault gate set; and a third step of defining a 1/0 stuck-at fault to each of output branch destinations of the suspected fault gates included in the suspected fault gate set and performing a fault simulation for each one test pattern, removing, for each fault simulation, the fault definitions of output branch destinations detected with normal outputs, and removing those of the suspected fault gates from which the fault definitions of all of the respective output branch destinations have been removed and those of the suspected fault gates with which, in any of the error test patterns, none of the fault definitions of the respective output branch destinations have not been detected with outputs which are determined to be errors with the error test pattern from the suspected fault gate set.

19. A recording medium as claimed in claim 18, wherein the third step includes:

(a) a step of defining a 1/0 stuck-at fault to each of output branch destinations of the suspected fault gates included in the suspected fault gate set;

(b) a step of receiving a test pattern as an input and determining, for each of the suspected fault gates included in the suspected fault gate set, at which output the 1/0 stuck-at fault of each of the output branch destinations is detected by a fault simulation performed by using the inputted test pattern;

(c) a step of removing the fault definitions of output branch destinations with which 1/0 stuck-at faults are detected with normal outputs of the test pattern and removing those of the suspected fault gates from which the fault definitions of all of the respective output branch destinations have been removed from the suspected fault gate set;

(d) a step of removing those of the suspected fault gates with which, where the test patter is an error test pattern, none of the fault definitions of the respective output branch destinations have not been detected with outputs which are determined to be errors with the error test pattern as a result of the fault simulation from the suspected fault gate set; and (e) a step of repeating the steps (a) to (d) if another test pattern remains.

20. A recording medium as claimed in claim 18, wherein the fault diagnosis program causes the computer to execute a fourth step of performing, for each of the suspected fault gates included in the suspected fault gate set, a simulation in which an error test pattern is used an output of the suspected fault gate is set to an indefinite value and removing any of the suspected fault gates with which at least one of those outputs which have been determined to be errors with the error test pattern exhibits a definite value from the suspected fault gate set.

21. A recording medium as claimed in claim 20, wherein the fourth step includes:

(a) a step of receiving an error test pattern as an input and determining, for each of the suspected fault gates included in the suspected fault gate set, an output of the fault diagnosis object circuit by a logic simulation performed by using the inputted error test pattern with an output of the suspected fault gate set to an indefinite value;

(b) a step of removing any of the suspected fault gates with which at least one of those outputs which have been determined to be errors with the error test pattern exhibits a definite value from the suspected fault gate set; and (c) a step of repeating the steps (a) and (b) if another error test pattern remains.

22. A recording medium as claimed in claim 20, wherein, for the suspected fault gate set after narrowing down of candidates for the suspected fault gate by the fourth step is performed, narrowing down of the candidates for the suspected fault gate by the third step is performed.

23. A recording medium as claimed in claim 18, wherein, in the first step, only those gates whose outputs are each branched into three or more branches are set as the candidates for the suspected fault gate.

24. A recording medium as claimed in claim 18, wherein the fault diagnosis program causes the computer to execute a fifth step of observing, for those of the suspected fault gates included in the suspected fault gate set after narrowing down of the candidates for the suspected fault gate is performed, gate output points and end points of branch destinations of wiring line patterns of the outputs using an internal signal observation apparatus such as an electron beam tester to confirm a fault on the wiring pattern.

* * * * *